US009622362B2

(12) United States Patent
Burrell et al.

(10) Patent No.: US 9,622,362 B2
(45) Date of Patent: Apr. 11, 2017

(54) MOUNT FOR CO-LOCATING AN ACCESS POINT AND AN ANTENNA

(71) Applicant: TESSCO Communications Incorporated, Hunt Valley, MD (US)

(72) Inventors: Dennis Burrell, Austin, TX (US); Timothy Ortel, Timonium, MD (US)

(73) Assignee: Tessco Communications Incorporated, Hunt Valley, MD (US)

( * ) Notice: Subject to any disclaimer, the term of this patent is extended or adjusted under 35 U.S.C. 154(b) by 0 days.

(21) Appl. No.: 14/795,972

(22) Filed: Jul. 10, 2015

(65) Prior Publication Data

US 2016/0014843 A1  Jan. 14, 2016

Related U.S. Application Data

(60) Provisional application No. 62/023,634, filed on Jul. 11, 2014.

(51) Int. Cl.
| H04B 1/38 | (2015.01) |
| H04M 1/00 | (2006.01) |
| H05K 5/02 | (2006.01) |
| H01Q 1/12 | (2006.01) |
| H04W 88/08 | (2009.01) |
| F16M 11/00 | (2006.01) |

(52) U.S. Cl.
CPC ........... *H05K 5/0204* (2013.01); *F16M 11/00* (2013.01); *H01Q 1/125* (2013.01); *H01Q 1/1221* (2013.01); *H04W 88/08* (2013.01)

(58) Field of Classification Search
CPC ......... H04W 88/08; H01Q 1/125; H01Q 1/12; H01Q 1/1221; H05K 5/0204; H16M 11/00
See application file for complete search history.

(56) References Cited

U.S. PATENT DOCUMENTS

| 6,735,450 | B1 * | 5/2004 | Remmert | H04B 1/38 361/688 |
| 7,071,885 | B2 * | 7/2006 | Noro | H01Q 1/12 343/712 |
| 7,156,674 | B1 * | 1/2007 | Frank | E05B 73/0005 439/133 |
| 8,344,953 | B1 * | 1/2013 | Gilbrech | H01Q 1/2266 343/700 MS |
| 2006/0211451 | A1 * | 9/2006 | Pak | H02G 3/123 455/561 |
| 2009/0168733 | A1 * | 7/2009 | MacFadyen | H01Q 1/1221 370/338 |
| 2011/0146163 | A1 * | 6/2011 | Naroditsky | H05K 5/0204 52/27 |

OTHER PUBLICATIONS

Oberon, Inc., Model 1013-00, Copyright 2014.

* cited by examiner

*Primary Examiner* — Nguyen Vo
(74) *Attorney, Agent, or Firm* — Shlesinger, Arkwright & Garvey LLP

(57) ABSTRACT

Mount for an access point and an antenna includes a base for attachment to a mounting structure, the base for attaching thereto an access point; and a tray pivotably attached to the base, the tray for attaching thereto an antenna. The tray is disposed above the base and the tray is positionable at an angle relative to a reference plane.

14 Claims, 6 Drawing Sheets

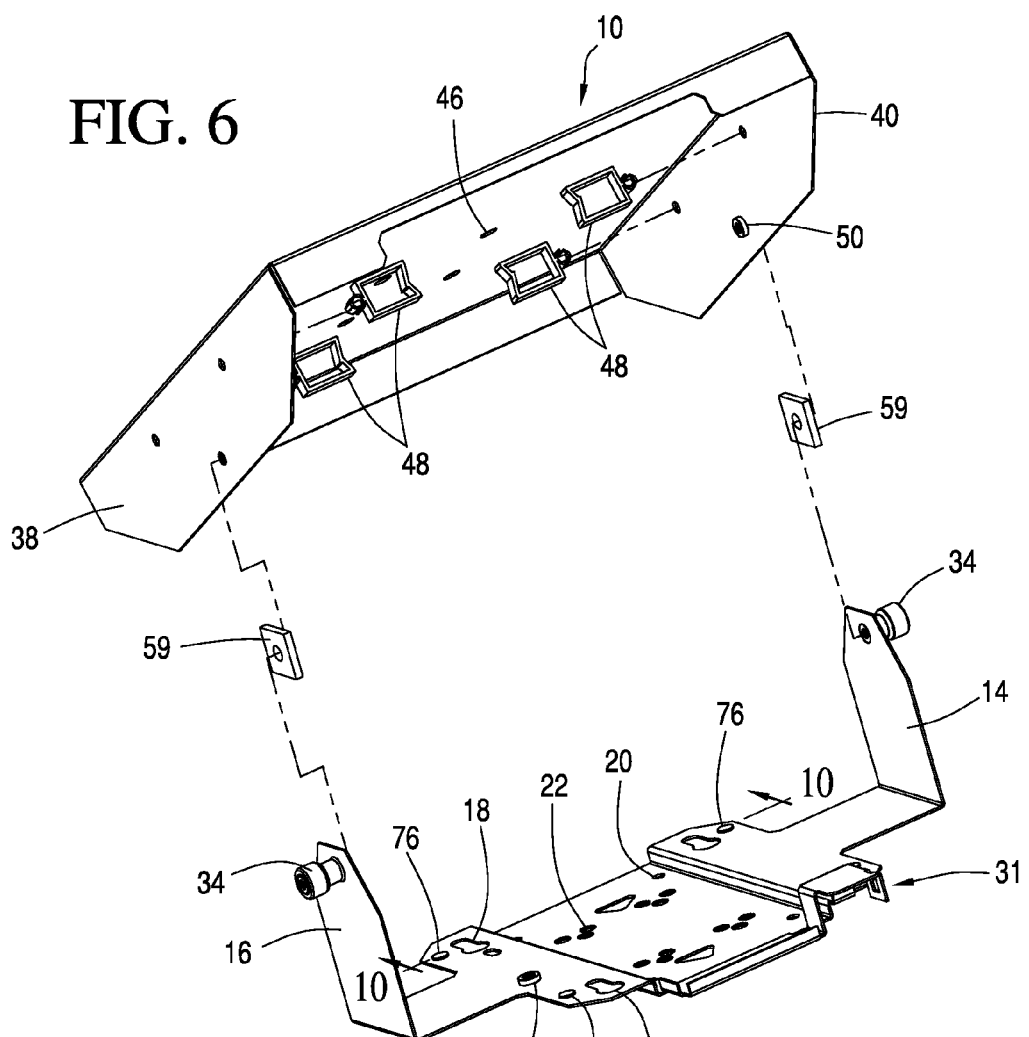
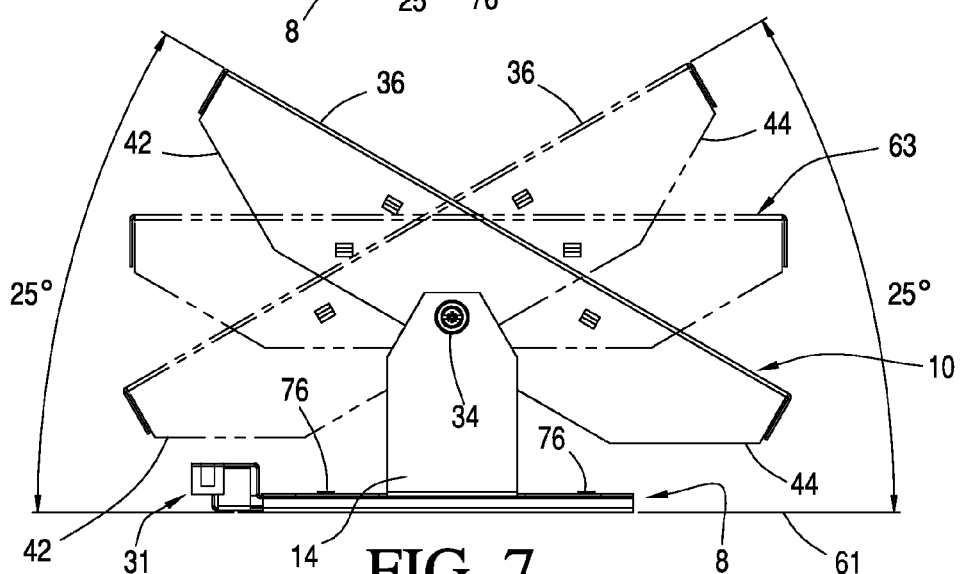

MOUNT FOR CO-LOCATING AN ACCESS POINT AND AN ANTENNA

RELATED APPLICATIONS

This is a nonprovisional application claiming the priority benefit of Provisional Application Ser. No. 62/023,634, filed on Jul. 11, 2014, hereby incorporated by reference.

FIELD OF THE INVENTION

The present invention relates to antennas and access points (radio transmitting devices) and the methods in which to locate them together such that they operate as a single apparatus instead of two distinct parts or components.

BACKGROUND OF THE INVENTION

Wireless communications are prevalent everywhere in today's society. Access points (radios) are used to provide wireless communication and antennas are used on the access points to transmit and receive data. The antennas used on access points are either internal or external antennas. Internal antennas are designed inside the access point and are inconspicuous to the users. External antennas are connected to the access port via coaxial cables and are seen by the users. When these access points are mounted to the ceiling or the wall, the antenna is mounted in as close proximity as possible to the access point. The cables and antenna can be bulky and not aesthetically pleasing to the owner of the structure (building) or users of the system.

The co-locating of antennas and access points has been accomplished in the past by mounting an enclosure on the wall or a pole/mast. The enclosure has the access point (radio) mounted to a back plate inside the enclosure and the antenna mounted onto the door of the enclosure. This type of design does not provide the articulation for the antenna and can be big, bulky and heavy.

Ceiling tile enclosures have been used to mount access points and external antennas but the antennas do not have a way for them to be articulated.

There have been other instances where the access point is mounted inside an enclosure that is mounted on the ceiling, replacing a ceiling tide grid. On the outside or in some case inside, the external antennas are mounted and connected to the access point.

SUMMARY OF THE INVENTION

The present invention provides a mount for an access point (radio) and an antenna, including a base for attachment to a mounting structure, the base for attaching thereto an access point; and a tray pivotably attached to the base, the tray for attaching thereto an antenna. The tray is disposed above the base and the tray is positionable at an angle relative to a reference plane.

The mount according to the present invention advantageously co-locates the antenna on top of the access point (radio) in a clamshell type of design. The antenna is attached in such a manner that it can swivel ±25 degrees such that it can be positioned to optimize its performance in conjunction with the radio. The mount is designed such that the cables from the antenna to the radio are hidden between the antenna and access point. There are clips that the cables are routed through that hold the cables in place. When the antenna and access point are attached to the mount, it looks as if there is only an antenna mounted for an aesthetic installation.

BRIEF DESCRIPTION OF THE DRAWINGS

FIG. 6 is an assembly view of the mount of FIG. 1.

FIG. 7 is a side elevational view of the mount of FIG. 2, showing the range of adjustment of the tray.

DETAILED DESCRIPTION OF THE INVENTION

Figure 1:
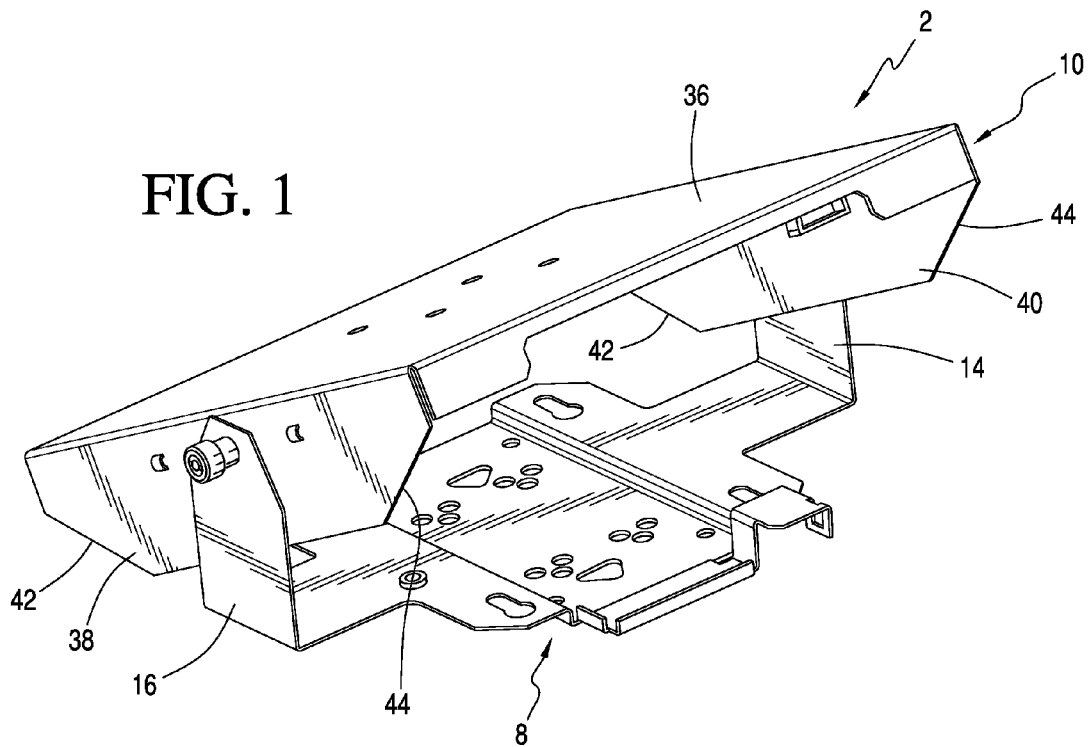
FIG. 1 is a perspective view of a mount showing a base for an access point and a tray for an antenna.
Figure 2:
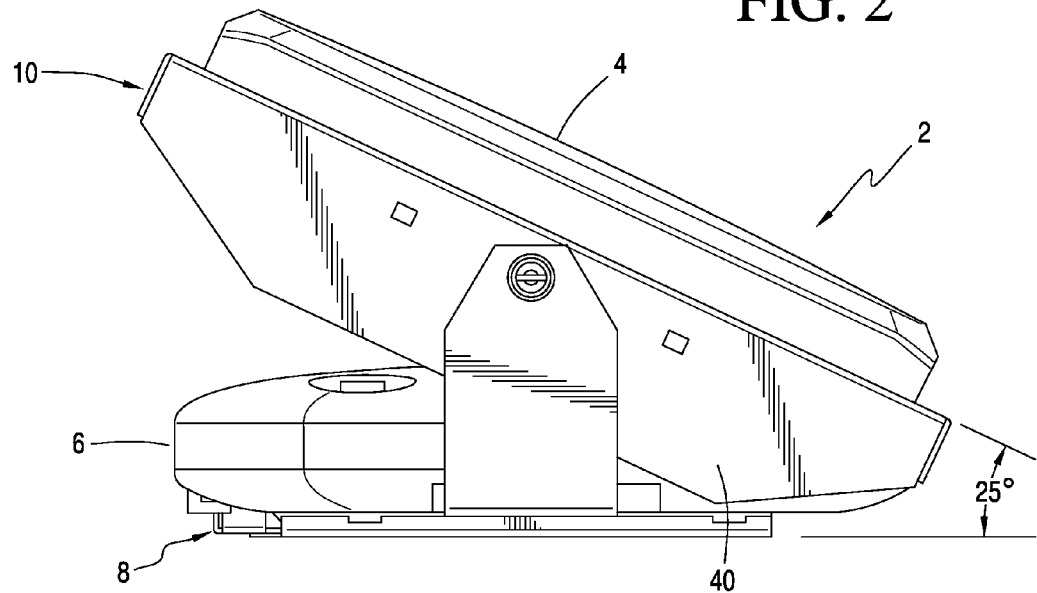
FIG. 2 as side elevational view of the mount of FIG. 1, showing an access point attached to the base and an antenna attached to the tray.

A mount 2 embodying the present invention for co-locating an antenna 4 and an access point (AP) 6 is disclosed in FIGS. 1 and 2. The mount 2 includes a base 8 and a tray 10 pivotably attached to the base 8.

Figure 3:
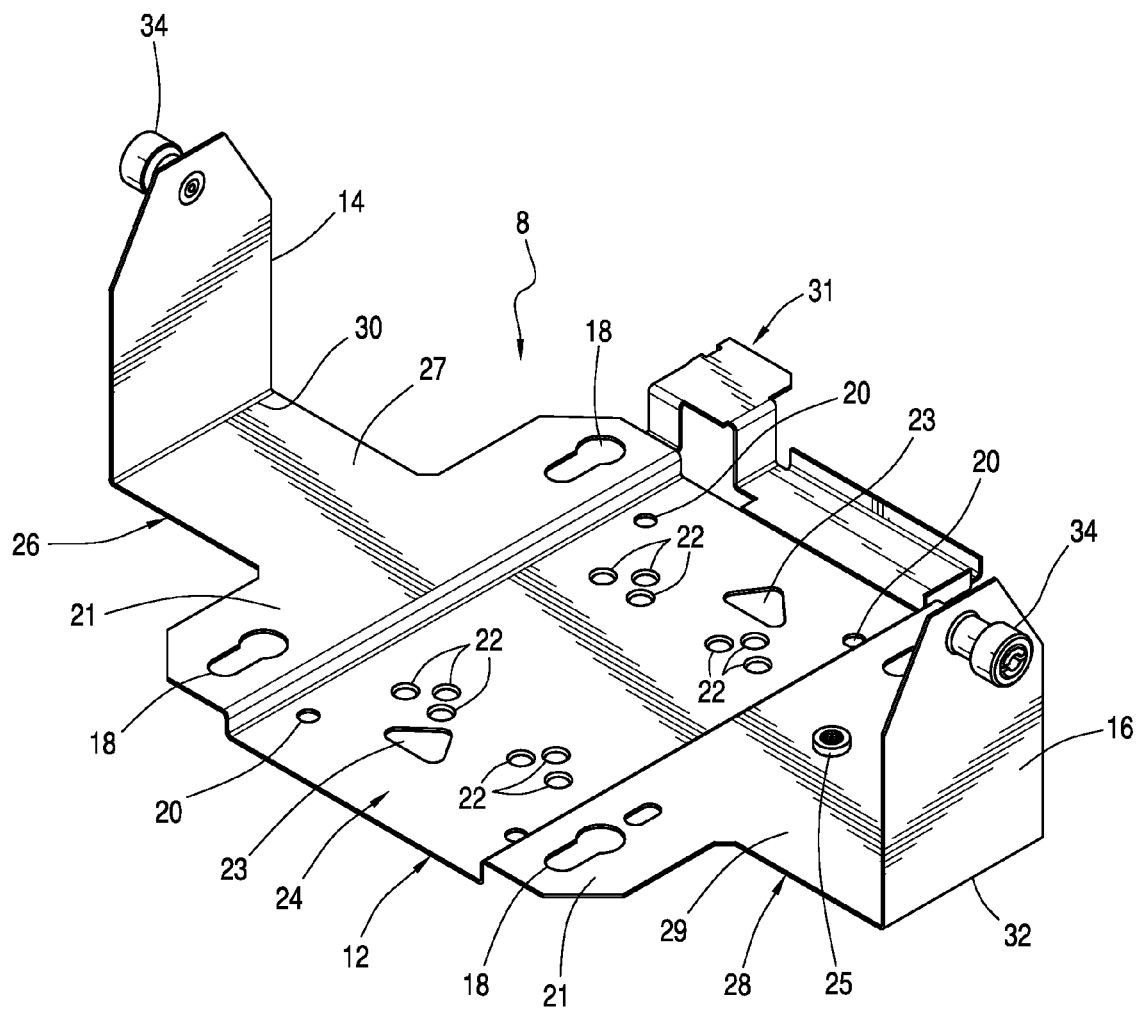
FIG. 3 is a perspective of the base of the mount.

Referring to FIG. 3, the base 8 is preferably formed from sheet metal into a substantially U-shaped structure with a base portion 12 and leg portions 14 and 16 extending from the base portion 12. Keyhole shaped openings 18 are provided on the base portion 12 for use in attaching the access point 6 to the base portion 12. Holes 20 are used to attach the base 8 to a vertical structure, such as wall of a building. Holes 22 and 23 are used to attach the base 8 to a ceiling tile grid using a standard clamp. A captured nut 25 is used to ground the access point 6.

A locking tab 31 is used to padlock the access point 6 if desired. The locking tab 31 is preferably made from sheet metal.

The base portion 12 includes a main base portion 24, attachment walls 21 and arms 26 and 28 extending from the intermediate portions 27 and 29 of the respective sides of the raised attachment walls 21. The attachment walls 21 are offset from the main base portion 24. Each of the arms 26 and 28 are bent preferably about 90° at intermediate portions 30 and 32 to form the legs 14 and 16 of the U-shaped base 8. The main base portion 24 is preferably substantially rectangular in plan view and the arms 26 and 28 are preferably longer than they are wide. Adjusting screws 34 are attached to the end portions of the respective leg portions 14 and 16 for attaching the tray 10 to the base 8.

The main base portion 24 is advantageously offset from the raised attachment walls 21 to provide clearance for the screws or other standard attachment hardware that is used to attach the base 8 to a support structure, such as the building wall or ceiling. The raised attachment walls 21 further provide for attaching the access point 6 to the base 8 after the base has been secured to the support structure.

Referring back to FIG. 1, the tray 10 includes a base wall 36 and side walls 38 and 40. The side walls 38 and 40 are preferably 90° to the base wall 36. The side walls 38 and 40 are advantageously pivotably attached to and angularly adjustable from the base 8 by means of the screws 34. Cut-out corners 42 and 44 are provided at opposite corners of each of the side walls 38 and 40 to provide clearance when the position of the tray 10 is adjusted angularly about the screws 34 (see FIG. 7).

Figure 4:
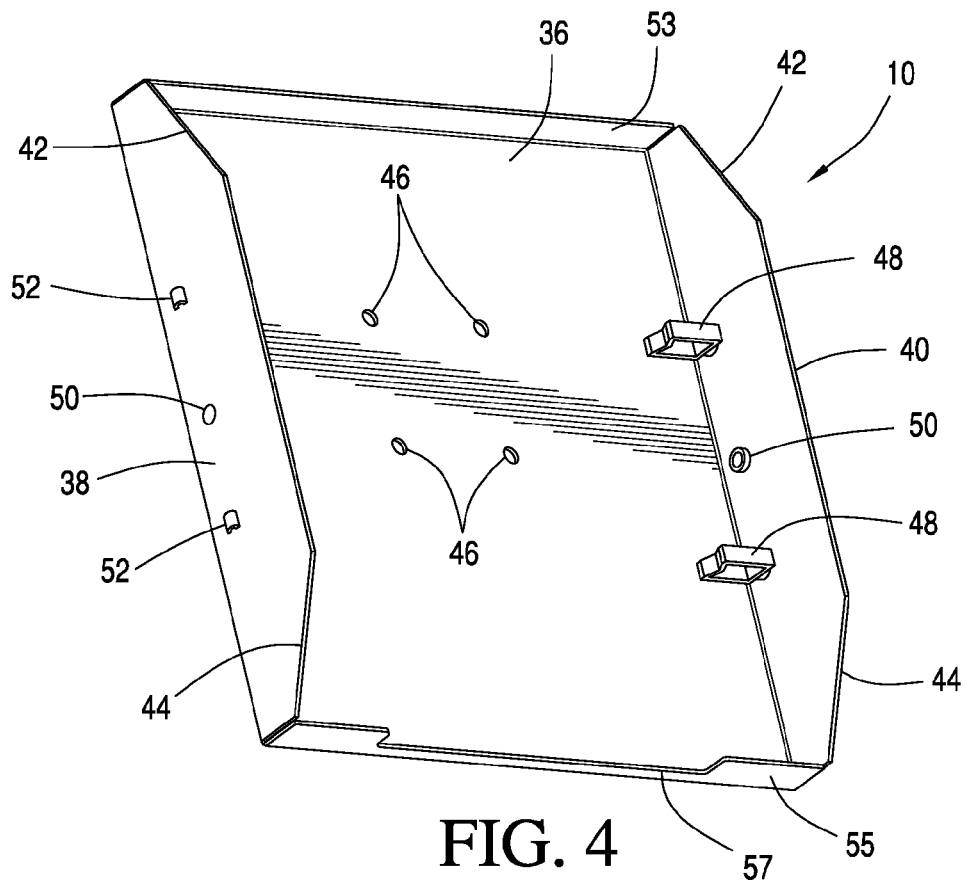
FIG. 4 is a perspective view of the bottom side of the tray.
Figure 5:
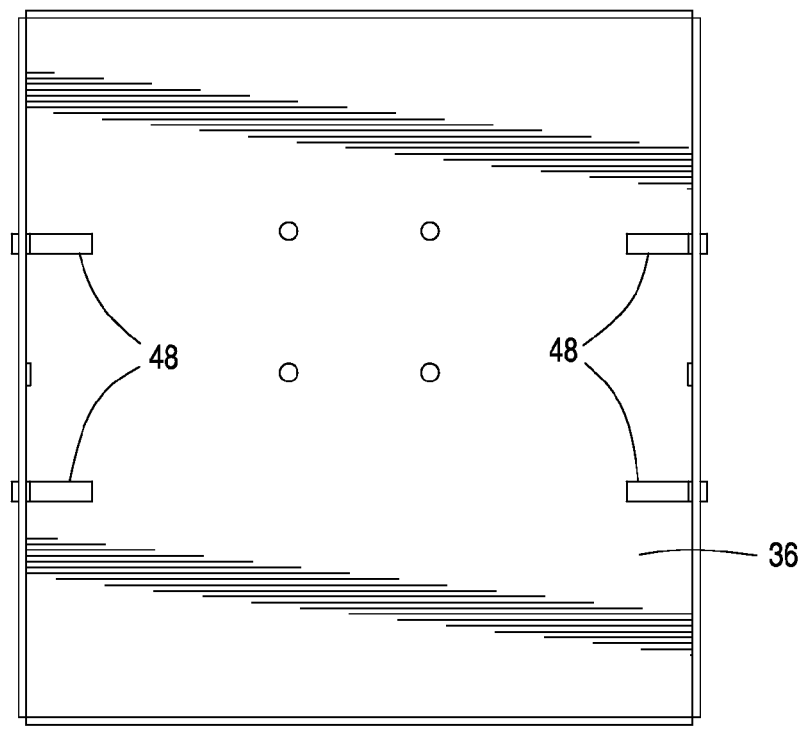
FIG. 5 is bottom plan view of the tray shown in FIG. 4.

Referring to FIGS. 4 and 5, the tray 10 is shown with the underside 45 visible. Holes 46 are disposed in the base wall 36 for screws to go through for attaching the antenna 4 to the tray 10. Cable holders 48 of standard construction are attached to the underside 45 along the corner between the base wall 36 and the side walls 38 and 40. The cable of the antenna 4 is routed underneath the tray 10 and held by the cable holders 48. Captured nuts 50 are attached in corresponding openings in the side walls 38 and 40 for threadedly receiving the adjusting screws 34. Holes 52 disposed in the side walls 38 and 40 are used for attaching the cable holders 48 to the tray 10.

Side walls 53 and 55 disposed preferably 90° to the base wall 36 advantageously provide structural rigidity to the base wall 36. A notch 57 advantageously provides space for cable routing between the antenna 4 and the access point 6.

Referring to FIG. 6, the mount 2 is shown in an assembly view. Adhesive backed foam washers 59 are disposed between the leg portion 16 and the side wall 38 and between the leg portion 14 and the side wall 40. The foam washers 52 include an adhesive on one surface for attachment to either the leg portions 14 and 16 or the side walls 38 and 40. The foam washers 52 advantageously provide friction between the confronting surfaces of the leg portion 16 and the side wall 38 and the leg portion 14 and the side wall 40 so that that tray 10 when pressed together with the adjusting screws 34 will be locked in the desired angular position and will tend to shift. A person of ordinary skill in the art will understand that metal to metal contact has less friction than metal to foam.

Raised dimples 76 are provided to securely hold the access point 6 in place. Each keyhole-shape opening 18 is associated with a raised dimple 76, which is disposed outwardly of the respective raised dimple 76.

Referring to FIG. 7, the base wall 36 of the tray 10 is angularly adjustable either clockwise or counterclockwise by about 25° relative to a reference plane 61 preferably parallel with the main base portion 24 from a base position 63 wherein the base wall 36 is parallel with the reference plane 61. Taking counterclockwise direction as positive and clockwise direction negative, the tray is adjustable about ±25°. The ability to provide antenna articulation of ±25° provided by the mount 2 advantageously allows for optimization of system performance via positioning of the antenna 4.

Figure 8:
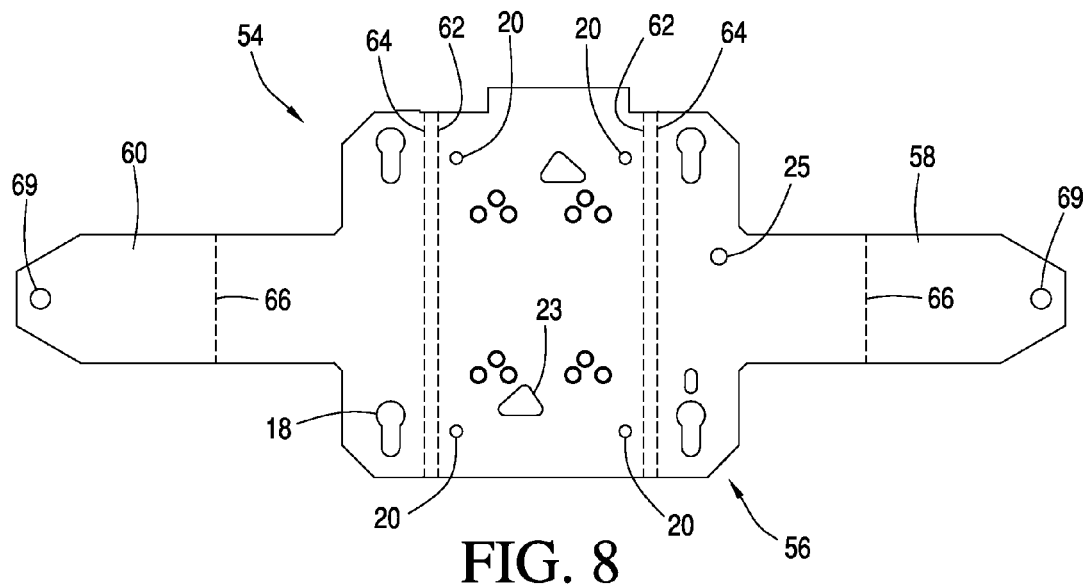
FIG. 8 is a blank of the base of mount.

Referring to FIG. 8, the base 8 is preferably made from a sheet metal blank 54 with a central portion 54 and arms 58 and 60. To make the base 8, the central portion 56 is bent up preferably 90° along lines 62 to form the main base portion 24 and bent down preferably 90° along lines 64 to form the attachment walls 21. The arms 58 and 60 are then bent up preferably 90° along lines 66 to form the leg portions 14 and 16. A tab 67 is used to attach the locking tab 31 to the base 10 by regular means, such as by spot welding. Holes 69 are provided for the screws 34.

Figure 9:
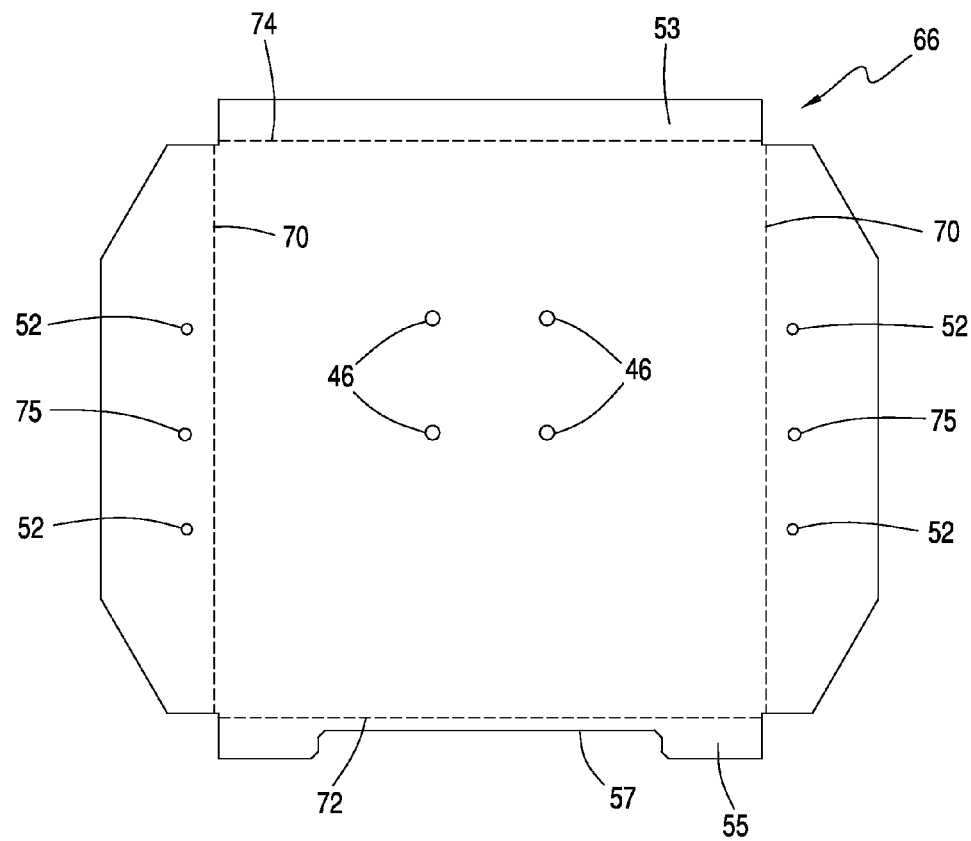
FIG. 9 is a blank of the tray.

Referring to FIG. 9, the tray 10 is preferably made from a sheet metal blank 68. To make the tray 10, the blank 66 is bent down preferably 90° along lines 70, 72 and 74 to form the side walls 38, 40, 53 and 55. Holes 75 are provided for the captured nuts 50.

Figure 10:
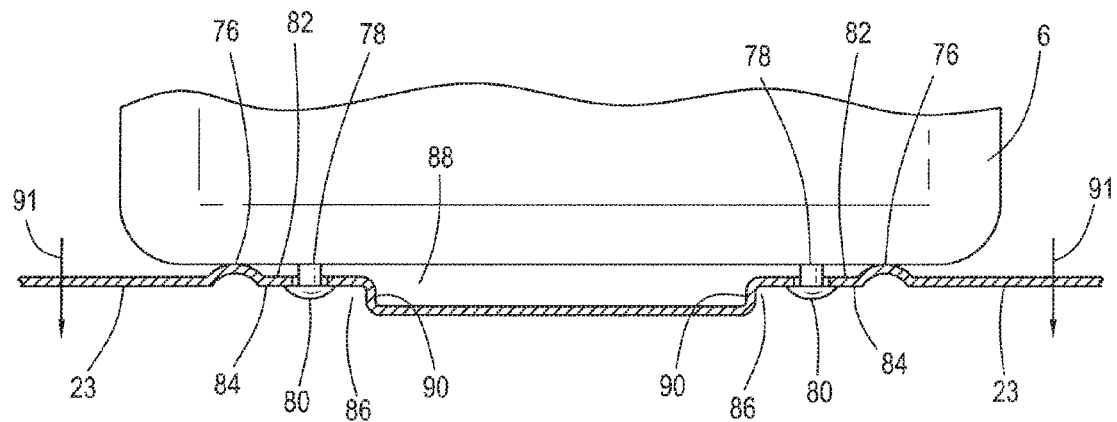
FIG. 10 is a cross-sectional view along lines 10-10 in FIG. 6.

Referring to FIG. 10, a partial cross-sectional view of the base 8 shows the manner of attaching the access point 6 to the base 8. Raised dimples 76 support the bottom surface of the access point 6. Attaching screws 78 includes flanges 80 substantially aligned with the top surface 82 of the attachment walls 23. When the attachment walls 23 are pressed down in the direction 91 and flex about the offset walls 90, the access point 6 moves down, allowing the screw flanges 80 to be positioned below the bottom surface 84 of the attachment walls 23. This allows the access point 6 to be translated on the attachment walls 23 so that the flanges 80 are then positioned below the narrow slot of the keyhole shaped openings 18. When the attachment walls 23 are released from the downward pressure generally indicated by the arrows 91, the attachment walls 23 flex back to their original position, thereby capturing the screw flanges 80 under the bottom surface 82. Thus, the access point 6 is securely attached to the attachment walls 23. The space 86 below the raised attachment walls 21 allows for the downward flexing of the attachment walls 21. The space 86 further provides clearance for the screw heads of the screws 80 from the surface of the support structure, such the building wall or ceiling. The offset 88 advantageously provides clearance for the screw heads or other standard hardware used to attach the base 8 to the support structure.

Once the base 8 is attached to the support structure and the access point 6 secured to the base 8, all attaching screws or attachment hardware are advantageously hidden from view and inaccessible, thereby deterring theft.

The mount 2 advantageously co-locates the antenna 4 on top of the access point (radio) 6 in a manner that generally hides the access point 6 from view to make it look like there is only the antenna 4 that is mounted. This is accomplished by having the tray 10 overly the base 8 at all sides of the base 8 (see FIGS. 2 and 7). The tray 10 also has downwardly disposed side walls 38, 40, 53 and 55 that hide portions of the access point 6 from view. The base 8 together with the tray 10 is similar to a clamshell. The mount 2 is designed such that the cables from the antenna 4 to the access point 6 are hidden.

The ability to co-locate the access point 6 and the antenna 4 and have this configuration operate as a single apparatus gives a distinct advantage over the current methods of hanging, placing or securing an access point on a wall or ceiling. The mount 2 advantageously saves space and is aesthetically pleasing.

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention or the limits of the appended claims.

We claim:

1. A mount for an antenna for an access point, comprising:
a) a base for attachment to a mounting structure;
b) a tray operably attached to said base, said tray is pivotable about an axis of rotation, said axis is stationary relative to said base and any radial distance between said tray and said axis is fixed at all angular positions of said tray, said tray for attaching thereto an antenna;
c) said tray is angularly positionable about said axis for positioning the antenna at a desired direction;
d) said base including a base portion and first and second leg portions extending from said base portion;
e) said tray including a base wall and first side wall and second side wall attached to said base wall;

f) said first leg portion is pivotably attached to said first side wall; and
g) said second leg portion is pivotably attached to said second side wall.

2. The mount of claim 1, wherein:
a) a first screw for pivotably attaching said first leg portion to said first side wall; and
b) a second screw for pivotably attaching said second leg portion to said second side wall.

3. The mount of claim 2, and further comprising:
a) a first adhesive-faced foam washer operably associated with said first screw, said first adhesive-faced foam washer is disposed between said first leg portion and said first side wall; and
b) a second adhesive-faced foam washer operably associated with said second screw, said second adhesive-faced foam washer is disposed between said second leg portion and said second side wall.

4. The mount of claim 1, wherein said tray is positionable about said axis about ±25°.

5. The mount of claim 1, wherein said base wall of said tray is for attaching thereto the antenna.

6. The mount of claim 5, and further comprising cable holders disposed below said base wall and attached to said tray for holding cable between the antenna and the access point.

7. The mount of claim 1, wherein said first and second side walls each includes cut-out corners.

8. The mount of claim 1, wherein said first and second leg portions are 90° to said base portion.

9. The mount of claim 1, wherein:
a) said base includes raised attachment walls for attaching an access point to said base;
b) said raised attachment walls including keyhole-shaped holes;
c) raised dimples disposed on said raised attachment walls, each of said raised dimples is associated with respective one of said keyhole-shaped holes; and
d) each of said raised dimples is disposed outwardly of respective one of said keyhole-shaped holes.

10. The mount of claim 9, wherein the access point when attached to said base hides from view and makes inaccessible an attachment hardware for attaching said base to a support structure.

11. The mount of claim 1, wherein:
said base portion includes a main base portion and attachment wall portions.

12. The mount of claim 1, wherein said first and second side walls are disposed 90° to said base wall.

13. The mount of claim 1, wherein said base is U-shaped.

14. The mount of claim 1, wherein said tray is U-shaped.

* * * * *